United States Patent
Kerr et al.

[11] Patent Number: 5,531,854
[45] Date of Patent: Jul. 2, 1996

[54] DE-LAMINATOR APPARATUS AND METHOD

[75] Inventors: Roger S. Kerr, Brockport; Hugh A. Cunningham, Penfield, both of N.Y.

[73] Assignee: Eastman Kodak Company, Rochester, N.Y.

[21] Appl. No.: 347,765

[22] Filed: Dec. 1, 1994

[51] Int. Cl.$^6$ .......................... G03C 11/12; G03C 1/805
[52] U.S. Cl. .................. 156/234; 156/289; 156/323; 156/344; 156/537; 430/256; 430/259
[58] Field of Search .......................... 156/289, 323, 156/344, 537, 584, 234; 271/280, 281, 285, 900; 354/354; 355/277, 278, 279, 311, 315; 430/256, 257, 258, 259, 260, 261, 262

[56] References Cited

U.S. PATENT DOCUMENTS

| | | | |
|---|---|---|---|
| 4,243,458 | 1/1981 | Giulie | 156/584 X |
| 5,141,584 | 8/1992 | Schuh et al. | 156/584 X |
| 5,169,474 | 12/1992 | Binder | 156/584 X |
| 5,200,297 | 4/1993 | Kelly | 430/253 |
| 5,203,942 | 4/1993 | DeCook et al. | 156/230 |
| 5,294,514 | 3/1994 | Lynch et al. | 430/203 |
| 5,393,639 | 2/1995 | Kourepenis | 430/256 X |

FOREIGN PATENT DOCUMENTS

| | | | |
|---|---|---|---|
| 526832 | 6/1956 | Canada | 156/289 |
| 60-69651 | 4/1985 | Japan | 430/258 |

*Primary Examiner*—Mark A. Osele
*Attorney, Agent, or Firm*—Milton S. Sales

[57] ABSTRACT

A laminating system for bonding, to receiver stock, a lamination sheet of the type including a carrier and a material to be applied to the receiver stock, and for de-laminating the carrier from the receiver stock after the material has been applied to the receiver stock includes a superposed sandwich of the lamination sheet and the receiver stock. A de-lamination leader is associated with one edge of the lamination sheet and the receiver, whereby the carrier can be easily peeled from the receiver stock starting at the one edge. The leader may be between the one edge of the lamination sheet and the receiver stock so that the edge does not laminate to the receiver stock upon application of heat and pressure. Alternatively, the leader may be butt joined to the one edge of the lamination sheet, such as by tape. A pair of adhesive stripes, one stripe being more adhesive than the other, may also be used to join the materials.

6 Claims, 7 Drawing Sheets

DE-LAMINATOR APPARATUS AND METHOD

BACKGROUND OF THE INVENTION

1. Technical Field

This invention relates generally to de-lamination of two pieces of media which have been laminated together such as by the use of heat and/or pressure, and more particularly to the use of a de-lamination leader to enable the easy breakage of the bond between the two pieces of laminated media so that the remaining portions of the pieces can be peeled apart.

2. Background Art

Proofing is the procedure used by the printing industry for creating representative images that replicate the appearance of printed images without the cost and time required to actually set up a high-speed, high-volume printing press to print an example of the images intended. Ideally, these representative images, or proofs, are generated, if in color, from the same color-separations used to produce the individual color printing plates used in printing presses so that variations in the resulting images can be minimized. Various proofing systems have been devised to create the proofs and have included the use of smaller, slower presses as well as means other than presses, such as photographic, electrophotographic, light imaging and non-photographic processes. The present invention is particularly useful in the field of proofing output devices.

KODAK Color Proofing Products provide a wide range of color proofing systems and materials to the graphics imaging industry. The KODAK Color Proofing Laminator is an important part of the color proofing systems for bonding lamination sheets to receiver stock. The lamination sheets include a carrier and a layer of material to be applied to the receiver stock, which, in the case of Kodak Color Proofing Products, is a color donor. A lamination sheet is laid upon the receiver stock with the color donor side sandwiched between the carrier and the receiver stock.

As shown in FIG. 1, the leading edge of the lamination sheet and receiver stock sandwich 10 is fed into a laminator 12, and the sandwich passes completely through a set of heated rollers, not shown. The laminated sandwich sits on an exit table 14 undisturbed until the trailing edge is cool to the touch, whereupon the top-most carrier 16 can be peeled away from receiver stock 18 and from the transferred color donor 20 as shown in FIG. 2. The carrier is then discarded. After de-lamination, the color proof is ready for any subsequent processing that may be required for the type of proof being made. For example, additional colors may be added by applying additional layers of color donor over the first, and repeating the cycle. Further details of this type of lamination/de-lamination system can be found in commonly-assigned, U.S. Pat. No. 5,203,942, which issued to B. DeCook et al. on Apr. 20, 1993.

Peeling the carrier of this particular media before it is cool risks color donor "pick-off" from the receiver stock. While the above-described KODAK Color Proofing Laminator works well for many intended materials, there are other materials that require peeling the carrier from the receiver stock while the sandwich is hot. An operator would be required to quickly grasp the hot sandwich as it emerges from the roller, manually break the seal between the leading edge of the carrier and the receiver stock (such as with a thumb nail), and peel the carrier as the sandwich progresses from the rollers.

DISCLOSE OF THE INVENTION

A laminating system for bonding, to receiver stock, a lamination sheet of the type including a carrier and a material to be applied to the receiver stock, and for de-laminating the carrier from the receiver stock after the material has been applied to the receiver stock includes a superposed sandwich of the lamination sheet and the receiver stock. According to a feature of the present invention, a de-lamination leader is associated with one edge of the lamination sheet and the receiver, whereby the carrier can be easily peeled from the receiver stock starting at the one edge. The leader may be between the one edge of the lamination sheet and the receiver stock so that the edge does not laminate to the receiver stock upon application of heat and pressure. Alternatively, the leader may be butt joined to the one edge of the lamination sheet, such as by tape. A pair of adhesive stripes, one stripe being more adhesive than the other, may also be used to join the materials.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

The present description will be directed in particular to elements forming part of, or cooperating more directly with, apparatus in accordance with the present invention. It is to be understood that elements not specifically shown or described may take various forms well known to those skilled in the art. For the sake of discussion, but not limitation, the preferred embodiment of the present invention will be described in relation to a laminating apparatus for making image proofs on a paper receiver stock, since the usual proofing practice is to make a hard copy of the image proof on paper. The present invention, however, is not limited to making hard copies of proof images on paper, since it can produce hard copies of images on a wide variety of media that may be used in the printing process.

Figure 1:
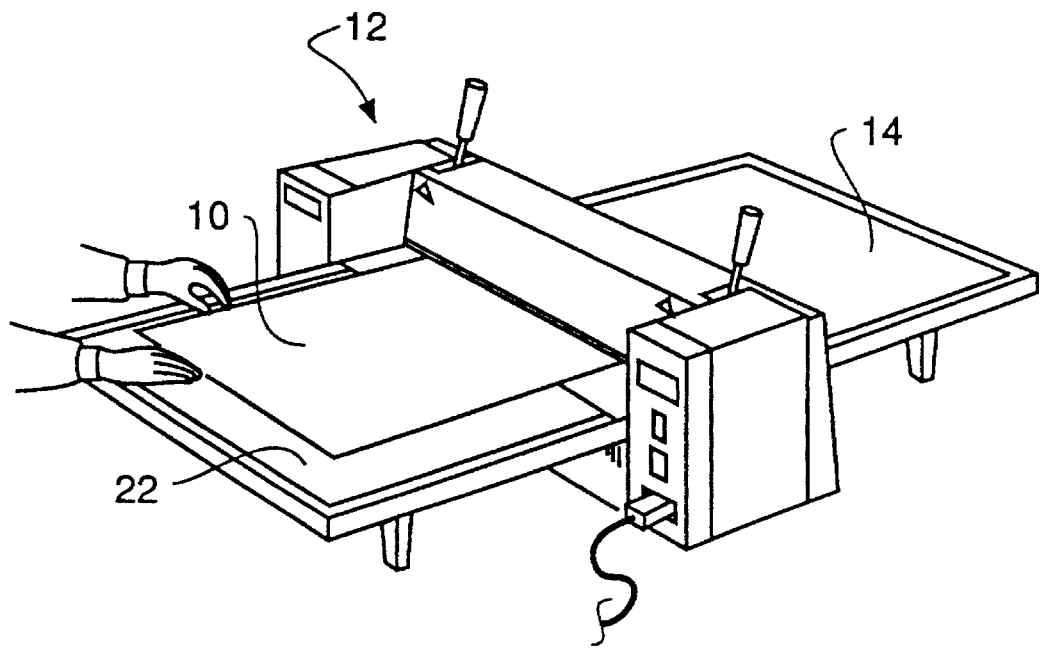
FIG. 1 shows a laminator known in the prior art.
Figure 2:
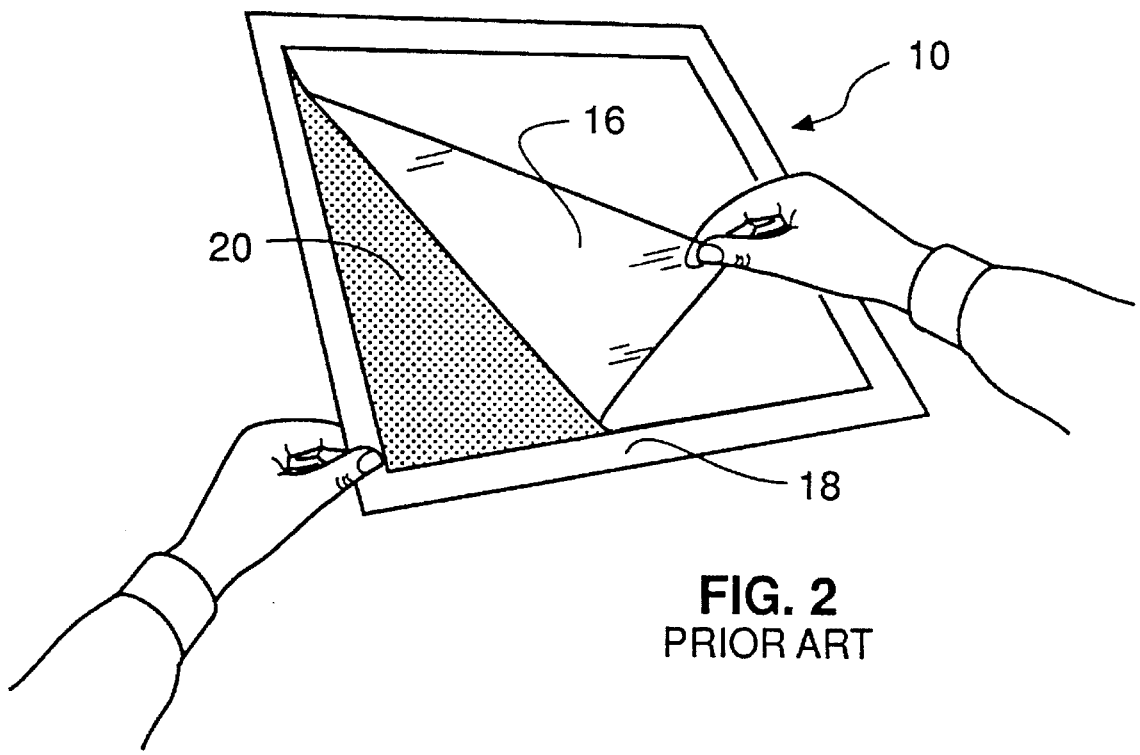
FIG. 2 shows a manual de-lamination method used in the prior art.
Figure 3:
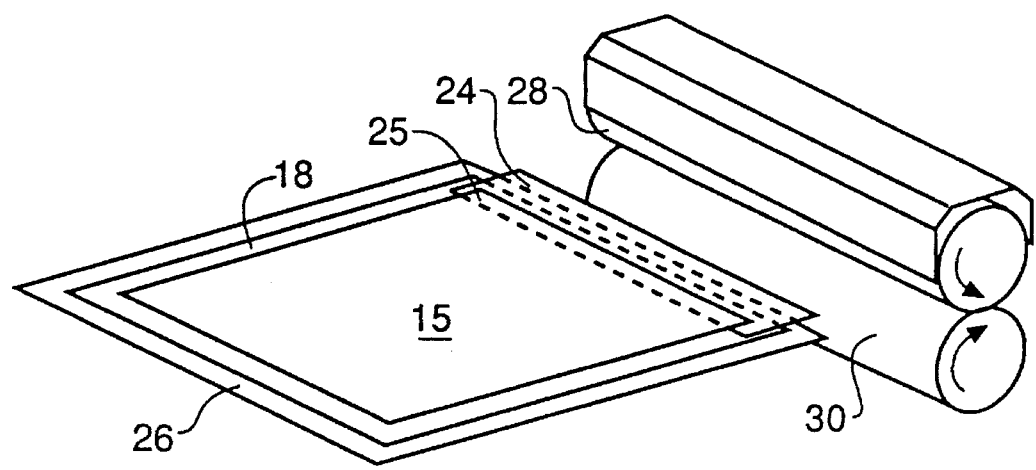
FIGS. 3–6 show the sequence of operation of a lamination system according to a preferred embodiment of the present invention.

FIG. 3 shows the rollers of laminator 12 of FIG. 1. The remainder of the laminator has been omitted from the FIG. 3 illustration for clarity. An assembled sandwich of lamination sheet 15 and receiver stock 18 is also shown in FIG. 3. Lamination sheet 15 includes a carrier 16 (FIG. 2) and, on the side of the carrier facing the receiver stock, a layer 20 of material to be applied to receiver stock 18 (such as color donor). The sandwich is assembled on the entrance (feed) table (reference numeral 22 in FIG. 1). Note that in FIG. 3, sandwich 10 has been illustrated as lying on an optional support sheet 26.

According to the present invention, a de-lamination leader 24 has been inserted between the leading edge 25 of lamination sheet 15 and receiver stock 18. As will become evident further in this specification, leader 24 is provided to enable easy breakage of the bond between carrier 16 and the receiver stock after lamination.

Figure 4:
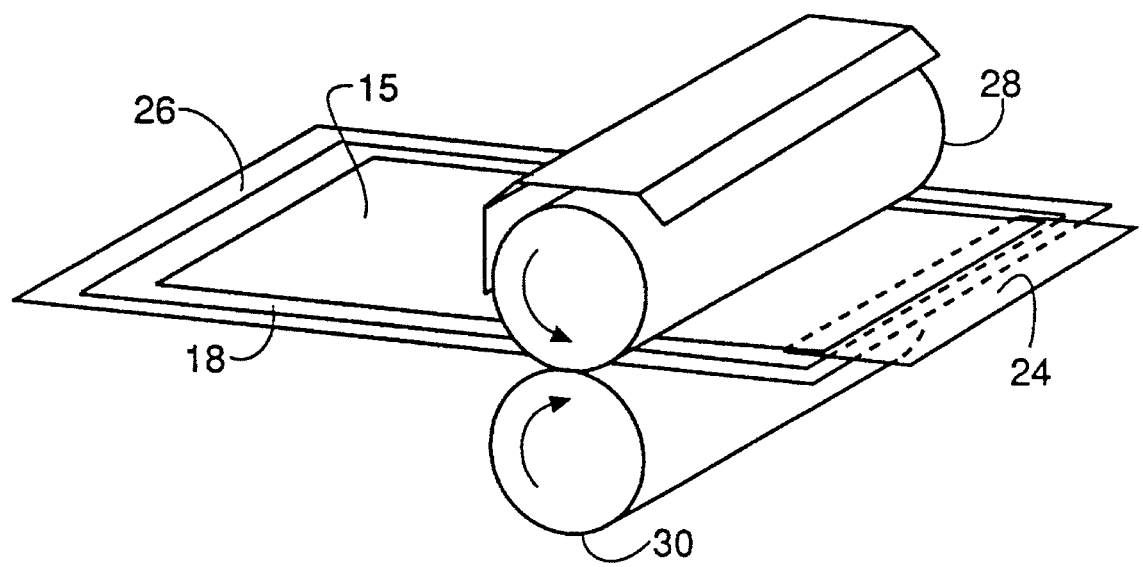
Figure 5:
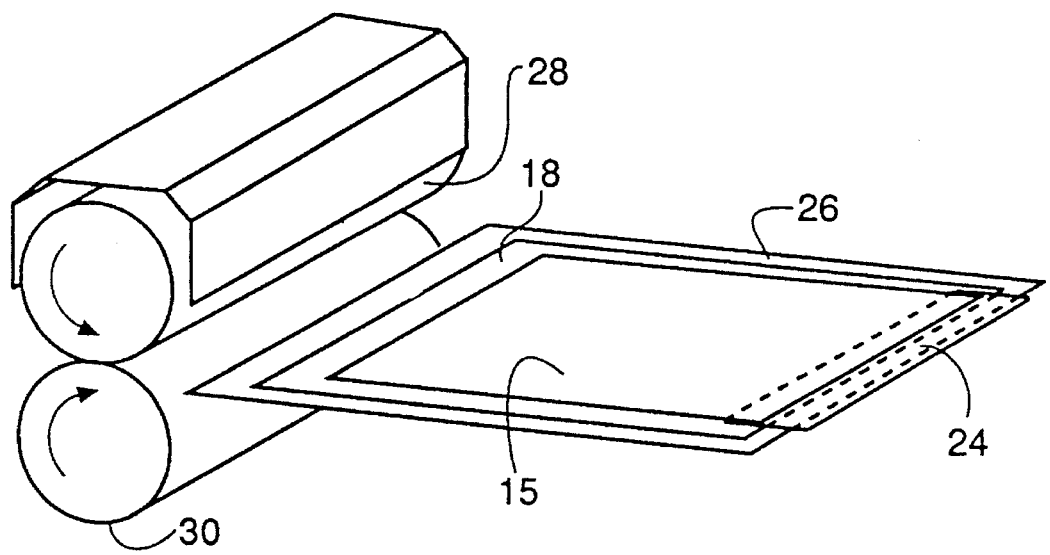

A pair of lamination rollers 28 and 30 contain heating elements that heat the roller surfaces. Referring to FIG. 4, pressure is applied to the rollers by an eccentric operated by levers 32 and 34 (FIG. 1). When a lamination sheet is positioned on the receiver stock and fed into the moving rollers, the lamination sheet and receiver stock are heated, pressed together and delivered to exit table 14 (shown in FIG. 1) with the carrier attached, as shown in FIG. 5. The material to be applied to the receiver stock (color donor) is laminated to the receiver stock when heat and pressure are applied to a heat-activated adhesive on the color donor.

Figure 6:
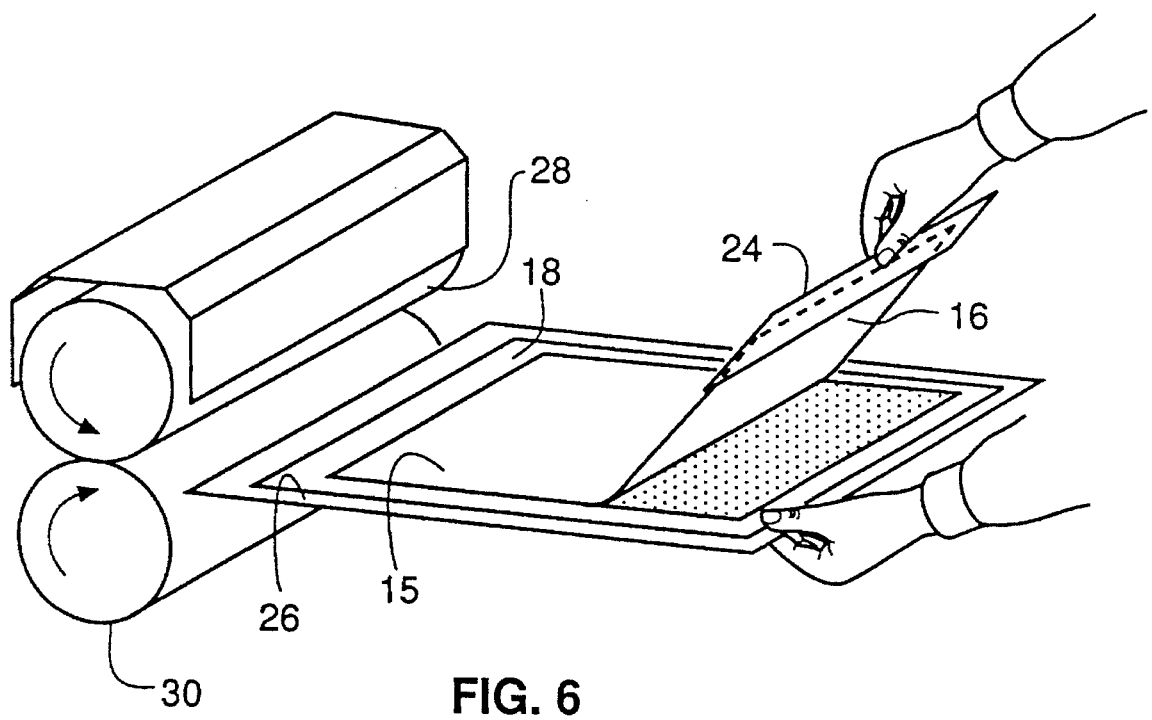

Leader 24 isolates lamination sheet 15 from receiver stock 18, preventing them from bonding at the leading edge of the lamination sheet. The leader also provides a region for an operator to grasp to separate the two portions of the sandwich, as shown in FIG. 6. When the carrier is peeled away, the color donor is left on the receiver stock.

This procedure is repeated, as necessary, to add more colors, until a complete proof has been obtained. A cover sheet, either matte or gloss-finished may be applied to the completed proof using the laminator.

Figure 7:
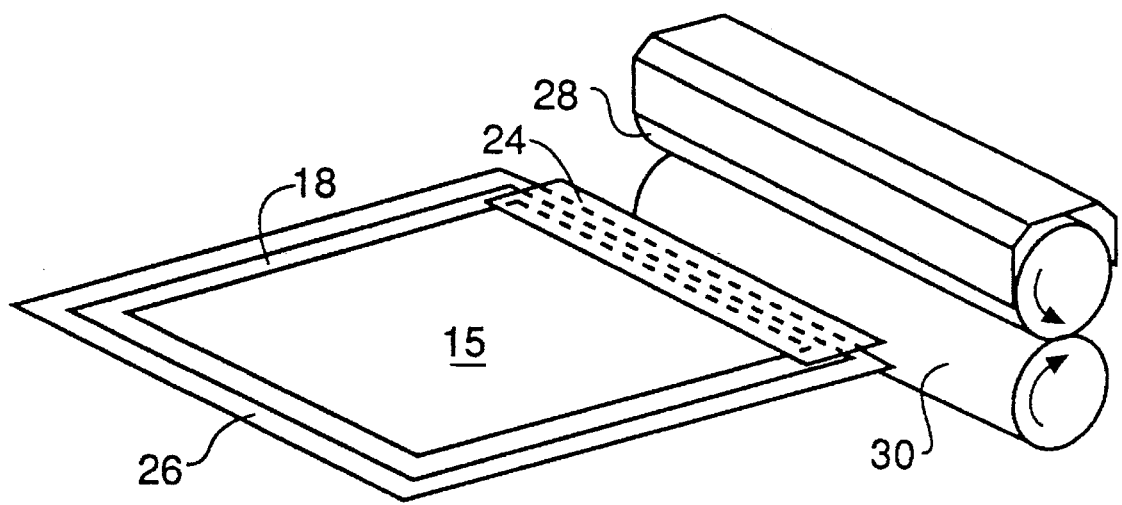
FIG. 7 depicts the lamination system according to a second embodiment of the present invention.
Figure 8:
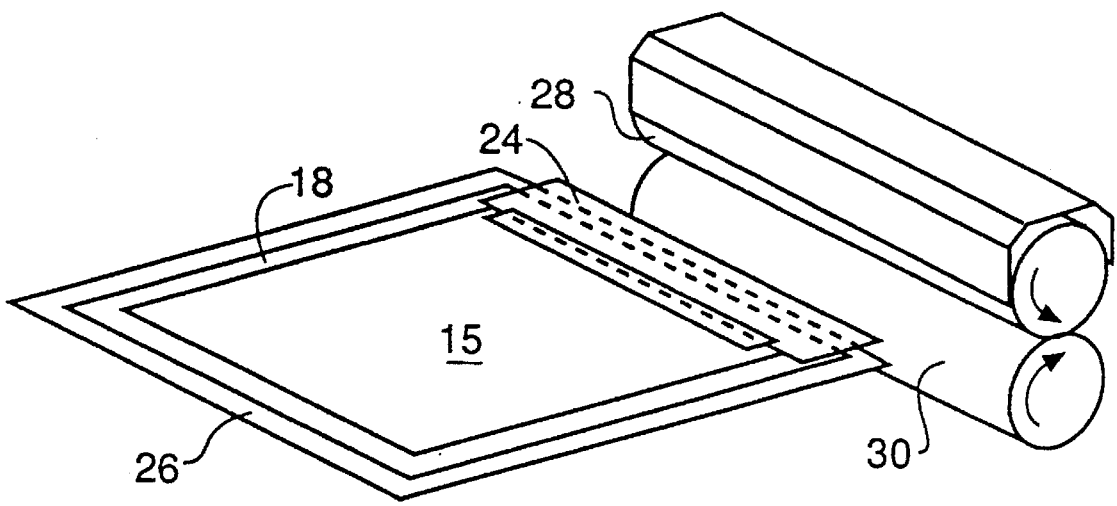
FIG. 8 depicts the lamination system according to a third embodiment of the present invention.
Figure 9:
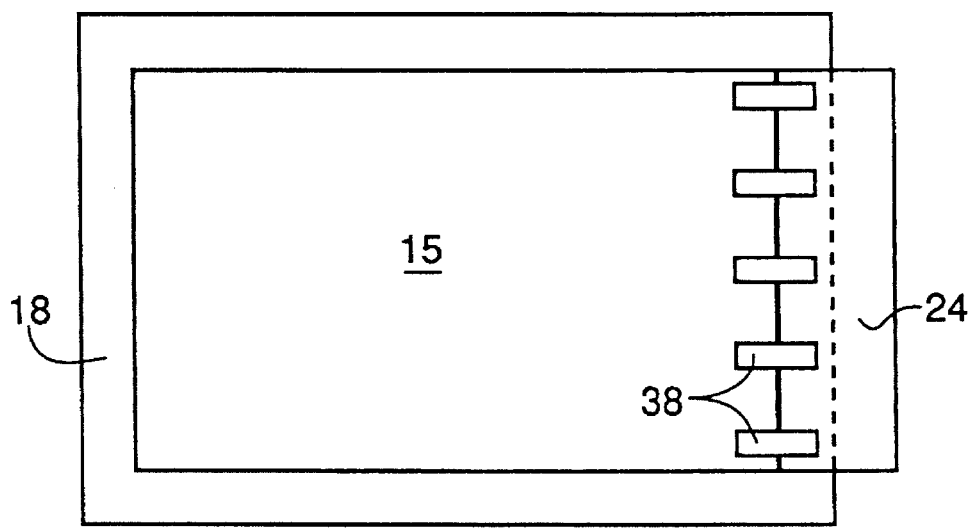
FIGS. 9 and 10 depict the lamination system according to a fourth embodiment of the present invention.
Figure 10:
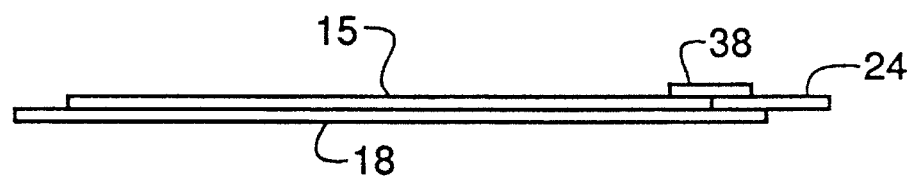
Figure 11:
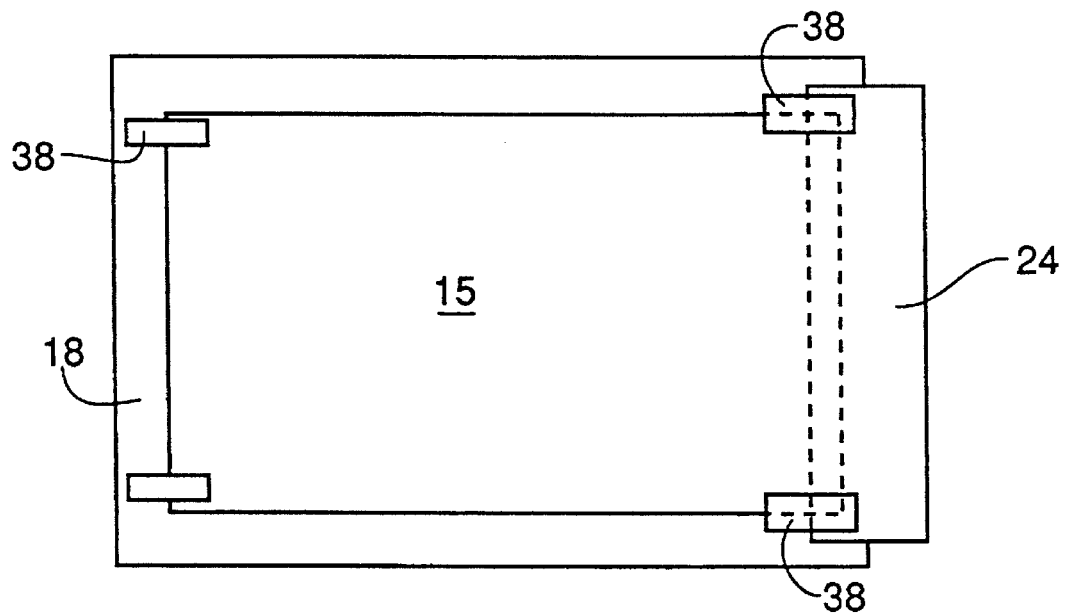
FIG. 11 depicts the lamination system according to a fifth embodiment of the present invention.

Within the scope of the present invention, there are several ways to assemble sandwich 10 with de-lamination leader 24 that will readily occur to those skilled in the art. While in the embodiment of FIGS. 3–6 the lamination leader is inserted between the lamination sheet and the receiver stock, FIG. 7 illustrates an embodiment in which the de-lamination leader is tacked to the top of the lamination sheet with a adhesive stripe on the under surface of the leader. This manner of assembly maximizes the transfer area of lamination sheet 15. FIG. 8 shows an embodiment in which the delamination leader is taped to the top of the lamination sheet. FIGS. 9 and 10 show de-lamination leader 24 butted edge-to-edge with the leading edge of lamination sheet 15 and joined by a plurality of pieces of single-sided tape 38. In the embodiment of FIG. 11, a region of de-lamination leader 24 underlies the leading portion of lamination sheet 15. Pieces of tape 38 may be used to hold the assembly together.

Figure 12:
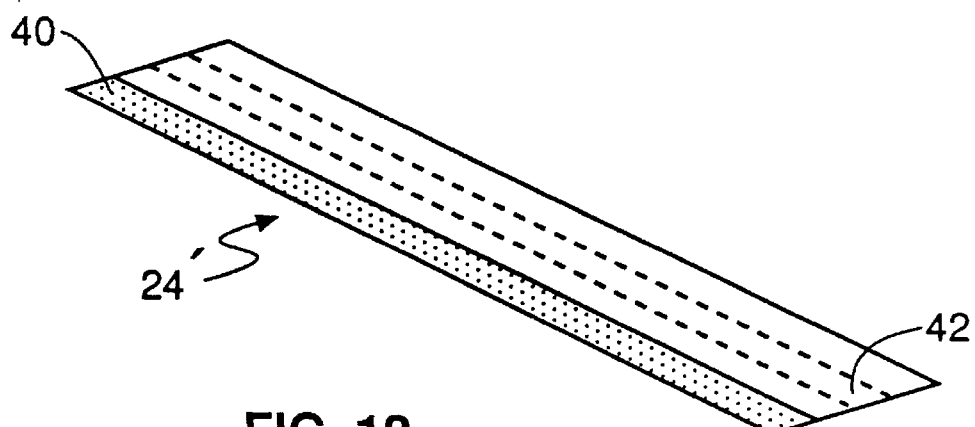
FIGS. 12 and 13 depict the lamination system according to a sixth embodiment of the present invention.
Figure 13:
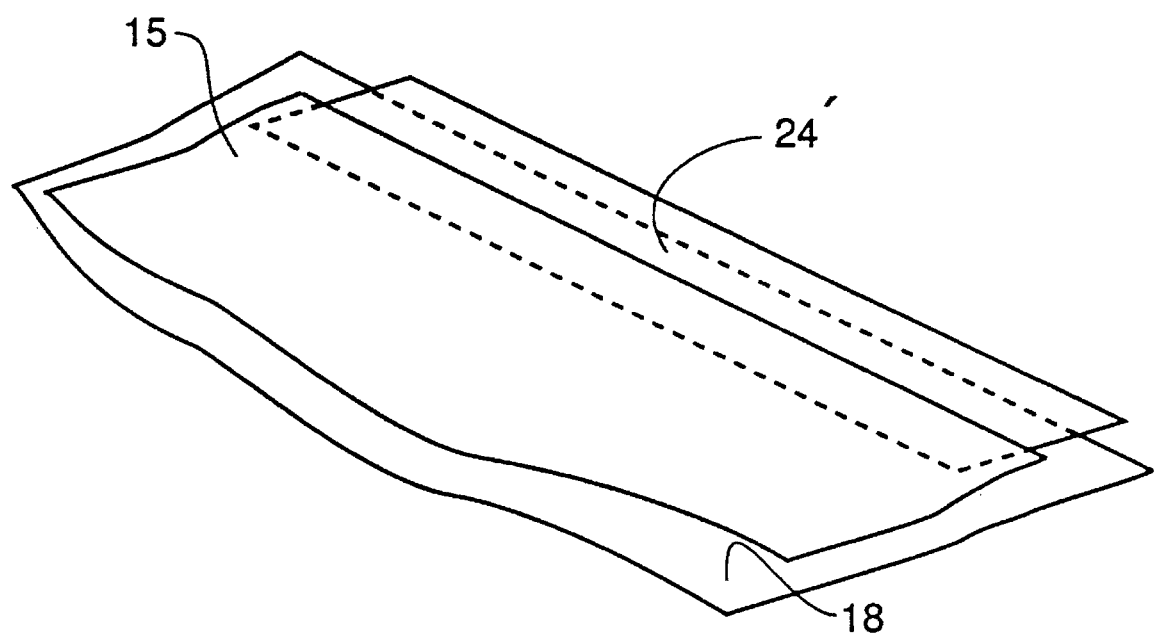

FIGS. 12 and 13 show another way to assemble the de-lamination leader to the receiver stock and lamination sheet. Leader 24' has a pressure-sensitive adhesive stripe 40 on the top and another 42 on the bottom. Stripe 40 has a greater adhesive force than does stripe 42. During assembly, the delamination leader is positioned on top of receiver stock 18 so that stripe 42 overlies the leading portion of the stock. The operator applies finger pressure to the top of the leader above stripe 42 to adhere the leader to the receiver stock. Lamination sheet 15 is positioned over the receiver stock with the leading portion of the lamination sheet aligned with stripe 40, and pressure is applied to complete the assembly. After lamination, the leader will separate more readily from the receiver stock than from the lamination sheet because of the differences in adhesive force of the two stripes.

Figure 14:
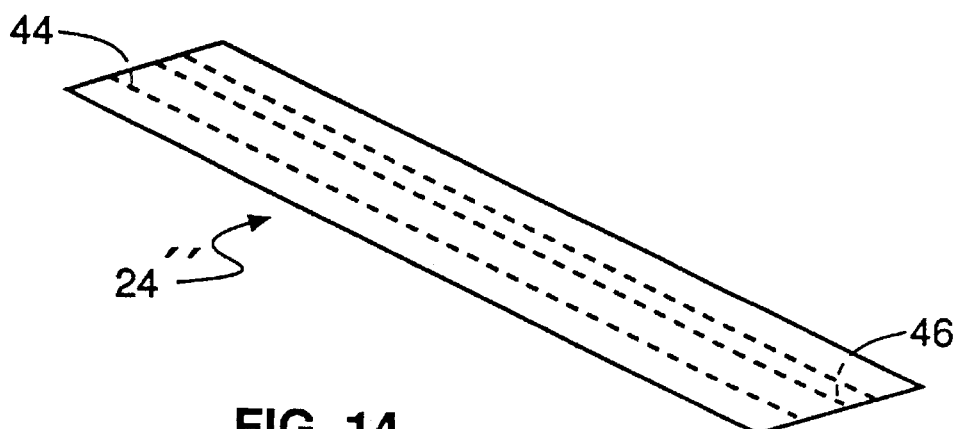
FIGS. 14 and 15 depict the lamination system according to a seventh embodiment of the present invention.
Figure 15:
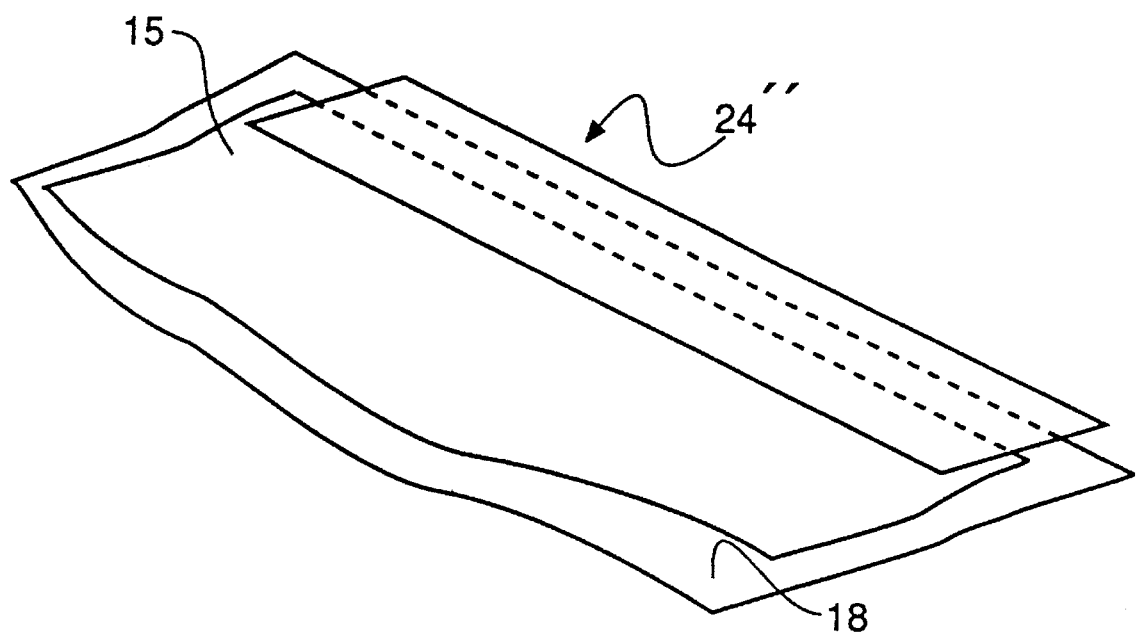

FIGS. 14 and 15 show yet another way to assemble the de-lamination leader to the receiver stock and lamination sheet. Leader 24" has a pair of pressure-sensitive adhesive stripes 44 and 46 on the bottom as oriented in the drawing. Stripe 44 has a greater adhesive force than does stripe 46. During assembly, lamination sheet 15 is positioned on top of receiver stock 18 so that the leading portion of the receiver stock extends beyond the leading portion of the lamination sheet. De-lamination leader 24" is placed on the assemblage so that stripe 44 overlies the leading portion of the lamination sheet and stripe 46 overlies the leading portion of the receiver stock. The operator applies finger pressure to the top of the leader above both stripes to adhere the leader to the lamination sheet and the receiver stock to complete the assembly. After lamination, the leader will separate more readily from the receiver stock than from the lamination sheet because of the differences in adhesive force of the two stripes.

The invention has been described in detail with particular reference to preferred embodiments thereof, but it will be understood that variations and modifications can be effected within the spirit and scope of the invention.

What is claimed is:

1. (Amended) In a laminating system for bonding to receiver stock, a lamination sheet of the type including a carrier and a material to be applied to the receiver stock, and for delaminating the carrier from the receiver stock after the material has been applied to the receiver stock, the improvement comprising;

a superposed sandwich of the lamination sheet and the receiver stock: and a de-lamination leader associated with one edge of the lamination sheet and the receiver wherein the leader has a pair of adhesive stripes, one stripe being more adhesive than the other, whereby the carrier can be easily peeled from the receiver stock starting at the one edge.

2. The improvement as set forth in claim 1 wherein the one stripe is attached to the lamination sheet and the other stripe is attached to the receiver stock.

3. A lamination process for bonding, to receiver stock, a lamination sheet of the type including a carrier and a material to be applied to the receiver stock, and for de-laminating the carrier from the receiver stock after the material has been applied to the receiver stock, the improvement comprising:

forming a superposed sandwich of the lamination sheet and the receiver stock with the material between the carrier and the receiver stock:

associating a delamination leader with one edge of the lamination sheet wherein the leader is associated with the lamination sheet by a pair of adhesive stripes, one stripe being more adhesive than the other;

applying heat and pressure to the sandwich and associated leader to thereby laminate the lamination sheet to the receiver stock; and peeling the carrier from the receiver stock starting at the un-laminated edge.

4. The lamination process as defined in claim 3 wherein the one stripe is attached to the lamination sheet and the other stripe is attached to the receiver stock.

5. In a laminating system for bonding, to receiver stock, a lamination sheet of the type including a carrier and a material to be applied to the receiver stock, and for de-laminating the carrier from the receiver stock after the material has been applied to the receiver stock, the improvement comprising:

a superposed sandwich of the lamination sheet and the receiver stock; and a de-lamination leader between one edge of the lamination sheet and the receiver stock so that said edge does not laminate to the receiver stock upon application of heat and pressure, wherein the leader has a pair of adhesive stripes, one stripe being more adhesive than the other, whereby the carrier can be easily peeled from the receiver stock starting at the one edge.

6. The improvement as set forth in claim 5 wherein the one stripe is attached to the lamination sheet and the other stripe is attached to the receiver stock.

* * * * *